United States Patent
Chang et al.

(10) Patent No.: US 8,803,823 B2
(45) Date of Patent: Aug. 12, 2014

(54) CAPACITIVE TOUCH SENSOR, TOUCH DETECTION DEVICE AND TOUCH TERMINAL

(75) Inventors: Hao Chang, Shenzhen (CN); Gengchun Deng, Shenzhen (CN)

(73) Assignee: Shenzhen Huiding Technology Co., Ltd., Shenzhen, Guangdong (CN)

( * ) Notice: Subject to any disclaimer, the term of this patent is extended or adjusted under 35 U.S.C. 154(b) by 151 days.

(21) Appl. No.: 13/069,405

(22) Filed: Mar. 23, 2011

(65) Prior Publication Data

US 2011/0187676 A1   Aug. 4, 2011

Related U.S. Application Data

(63) Continuation of application No. PCT/CN2011/070673, filed on Jan. 26, 2011.

(30) Foreign Application Priority Data

Feb. 24, 2010   (CN) ...................... 2010 2 0110486 U

(51) Int. Cl.
*G06F 3/041*   (2006.01)

(52) U.S. Cl.
USPC .......................................... 345/173

(58) Field of Classification Search
USPC .................. 345/173–174; 178/18.06
See application file for complete search history.

(56) References Cited

U.S. PATENT DOCUMENTS

| 8,269,743 | B2 * | 9/2012 | Kuo et al. ..................... 345/174 |
| 8,279,187 | B2 * | 10/2012 | Geaghan ....................... 345/173 |
| 2009/0213090 | A1 * | 8/2009 | Mamba et al. ................ 345/174 |

* cited by examiner

*Primary Examiner* — Srilakshmi K Kumar
*Assistant Examiner* — Damon Treitler
(74) *Attorney, Agent, or Firm* — Kenyon & Kenyon LLP

(57) ABSTRACT

The present invention relates to touch detection technology and provides a capacitive touch sensor which comprises a driving electrode layer and a sensing electrode layer. An insulating isolation layer is disposed between the sensing electrode layer and the driving electrode layer. A touch panel is disposed over the sensing electrode layer, and the sensing electrode layer has hollowed-out sensing electrodes. The present invention provides a new sensor structure in which the sensing electrode layer (such diamond, rectangular, round etc.) is hollowed-out to improve sensitivity of touch detection and the signal to noise ratio (SNR).

4 Claims, 6 Drawing Sheets

CAPACITIVE TOUCH SENSOR, TOUCH DETECTION DEVICE AND TOUCH TERMINAL

CROSS REFERENCE TO RELATED APPLICATIONS

This application is a Continuation application of international application PCT/CN11/070,673, filed on Jan. 26, 2011, which claims priority of Chinese patent application 201020110486.1, filed on Feb. 4, 2010. These two applications are incorporated herein by reference.

FIELD OF THE INVENTION

The present invention relates to touch detection technology, and more particularly to a capacitive touch sensor, a touch detection device and a touch terminal.

BACKGROUND OF THE INVENTION

An existing capacitive touch sensor is implemented as shown in FIG. 1 (a single-touch structure or a cell of a multi-touch structure), including from top to bottom a touch panel 11, a sensing electrode layer 12, an insulating isolation layer 13, a driving electrode layer 14 and a substrate 15. The touch panel 11 can be made of glass, acrylic or PVC type material. In this capacitive touch sensor, there is a large overlapping area between a driving electrode of the driving electrode layer 14 and a sensing electrode of the sensing electrode layer 12, the initial capacitance between the driving electrode and the sensing electrode is thus relatively large. At the same time, most of the electric field lines EL are between the driving electrode 14 and the sensing electrode 12. Therefore, only a few electric field lines beyond the overlapping area can be contacted when a finger touches the touch panel 11, and only a small change in capacitance can be generated between the driving electrode 14 and the sensing electrode 12. That is, the capacitive touch sensor has a small capacitance change rate when touched. Because of this defect, only a small change in data acquisition can be detected by the detection circuit, and as a result the sensitivity of the capacitive touch sensor is not ideally high and the signal to noise ratio (SNR) is quite small, and a rather complex filtering processing by software should be engaged to compensate for it in this case.

SUMMARY OF THE INVENTION

Therefore, the present invention is to provide a capacitive touch sensor, a touch detection device and a touch terminal with high sensitivity.

A capacitive touch sensor provided in the invention comprises a driving electrode layer and a sensing electrode layer, an insulating isolation layer is disposed between the sensing electrode layer and the driving electrode layer, a touch panel is disposed over the sensing electrode layer, and the sensing electrode layer has sensing electrodes with hollowed-out pattern.

Further, each sensing electrode of the sensing electrode layer has one hollowed-out region or multiple hollowed-out regions separate from each other.

Further, suspended blocks are filled inside the hollowed-out sensing electrodes and/or between the sensing electrodes of the sensing electrode layer; and gaps are left between the suspended blocks and the sensing electrodes of the sensing electrode layer.

Further, the solid area of a hollowed-out part of each sensing electrode of the sensing electrode layer fully overlaps a driving electrode of the driving electrode layer.

A touch detection device provided in the invention comprises any one of the above-mentioned capacitive touch sensors, and a touch controller connected to the capacitive touch sensor.

A touch terminal provided in the invention comprises a touch detection device as above-mentioned.

The present invention provides a new sensor structure in which the sensing-electrode layer (either in a pattern of diamond, rectangular, round etc.) is hollowed-out to improve sensitivity of touch detection and the signal to noise ratio (SNR). To ensure uniform light transmittance, suspended blocks can be filled in the hollowed-out regions or between the sensing electrodes. The new sensor structure can be applied in various touch screen terminals and other kinds of touch terminals.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

In embodiments of the present invention, to overcome the shortcomings that the existing capacitive touch sensors have, i.e., the above-mentioned large initial capacitance and small change in capacitance when touched, new sensor structures for capacitive touch sensing detection devices having a sensing electrode layer (such as diamond, rectangular, round, etc.) with hollowed-out pattern, are proposed.

Figure 1:
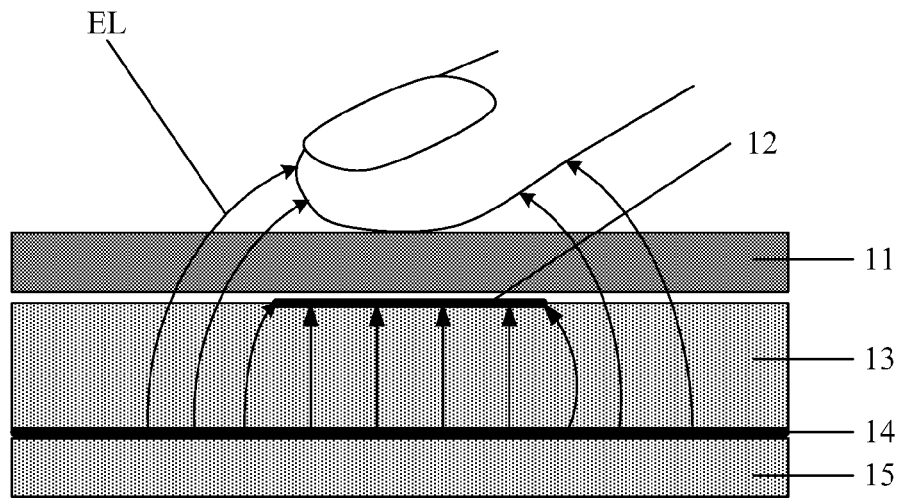
FIG. 1 shows an implementation principle of a conventional capacitive touch sensor.
Figure 2:
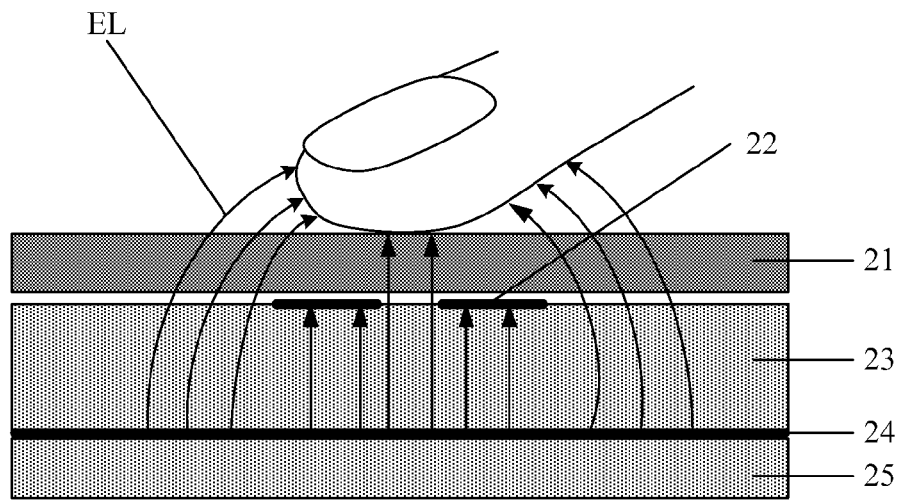
FIG. 2 shows an implementation principle of a capacitive touch sensor according to an embodiment of the present invention.

FIG. 2 shows an implementation principle of a capacitive touch sensor according to an embodiment of the present invention.

Referring to FIG. 2, a driving electrode layer 24 with one or multiple driving electrodes is closely layed out on a bottom surface of an insulating isolation layer 23. A sensing electrode layer 22 with one or multiple sensing electrodes is closely layed out on a top surface of the insulating isolation layer 23. A touch panel 21 is configured above the sensing electrode layer 22. A substrate 25 is optionally configured on a bottom surface of the driving electrode layer 24. In this embodiment, the sensing electrode layer 22 has hollowed-out regions.

Let an initial capacitance between the driving electrode layer 24 and the sensing electrode layer 22 be $C_0$, and that the capacitance is decreased to be $C_T$ after the touch panel 11 is touched, therefore, the capacitance change rate is:

$$\delta = (C_0 - C_T)/C_0 \quad (1)$$

As shown from the above formula (1), the capacitance change rate caused by touching the detection point can be increased by increasing the difference between $C_0$ and $C_T$, so as to improve detection control circuits to detect and recognize the touch operation.

Reference to the parallel-plate capacitor formula:

$$C = \in S/(4\pi k d) \quad (2)$$

Wherein, $\in$ is a dielectric constant, S is an overlapping area of the top and bottom substrates, k is an electrostatic constant, and d is a distance between the top and bottom substrates. It can be known from the formula (2) that the value of the capacitor C is linearly proportional to the overlapping area of the parallel plate capacitor. Of course, in a capacitive touch button and a touch screen, the capacitor formed by the driving electrode layer and the sensing electrode layer is a non-standard parallel plate capacitor, but the capacitance is still proportional to the overlapping area. In the embodiments of the present invention, the overlapping area between the driving electrode and the sensing electrode is decreased and the initial capacitance $C_0$ is thereby decreased, by hollowing out the sensing electrode layer.

Since the sensing electrode layer 22 is hollowed-out, more electric field lines between the driving electrode layer 24 and the sensing electrode layer 22 can be extended beyond the overlapping area than those in conventional capacitive touch sensors. Thus, more electric field lines can be touched by finger, and a larger change in capacitance can be caused, that is, the value of $C_0 - C_T$ is increased. Therefore, the capacitance change rate of the capacitive touch sensor as shown in FIG. 2 is increased largely when the capacitive touch sensor is touched by finger; this means that sensitivity of the capacitive touch sensor is also improved.

In the embodiments, it is at least ensured that the non-hollowed-out region, or solid conductive region of each sensing electrode of the sensing electrode layer 22 fully overlaps a driving electrode of the driving electrode layer 24, so that the sensing electrode can be shielded against interference from a lower component such as an LCD by the overlapped driving electrode.

Figure 3:
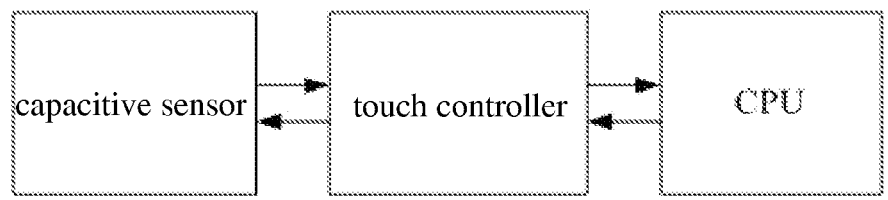
FIG. 3 is a block diagram of a touch detection device using the above-mentioned capacitive touch sensor of the present invention.

FIG. 3 is a block diagram of a touch detection device using the above-mentioned capacitive touch sensor of the present invention. A touch controller of the touch detection device is configured for scanning detection and control, processing and calculating sampled data, and further outputting a coordinate to an upper CPU. The upper CPU processes the received coordinate.

Figure 4A:
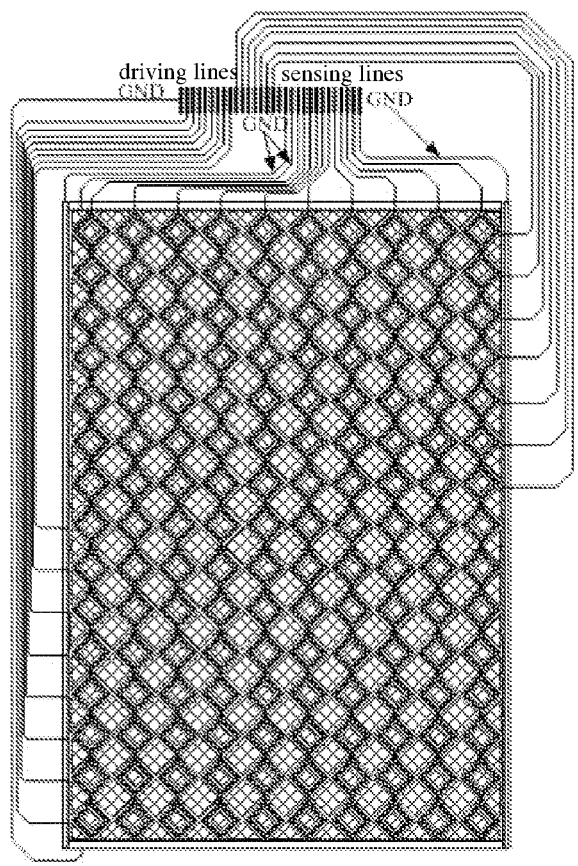
FIGS. 4A~4C are schematic diagrams of an entire capacitive multi-touch screen structure, a sensing electrode layer and a driving electrode layer of it respectively, according to the present invention.
Figure 4B:
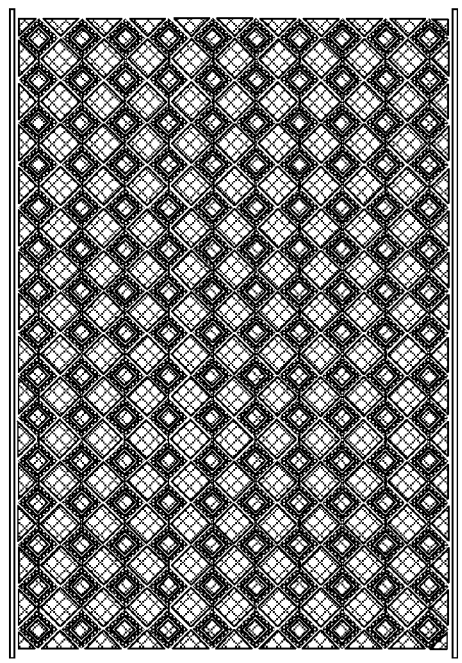
Figure 4C:
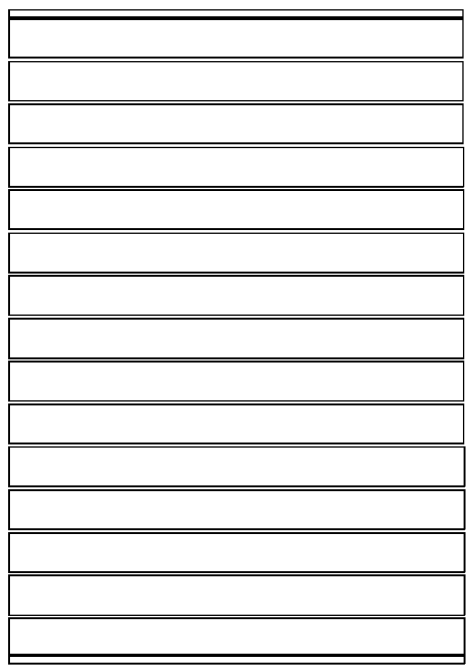

FIGS. 4A~4C are respectively schematic diagrams of an entire screen structure, a sensing electrode layer and a driving electrode layer of a multi-touch capacitive structure which can be realized by the above-mentioned technology. The experiments prove that the capacitive structure has advantages of small initial capacitance at the detection point, large capacitance change rate when touched by finger, strong detected signal data, high sensitivity, and greatly improved signal to noise ratio (SNR) of the detection data.

Figure 5:
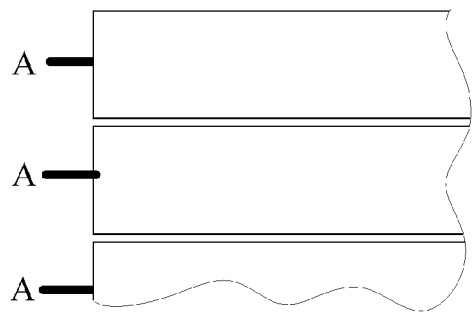
FIG. 5 is a schematic diagram, partially showing a driving electrode layer and leads A of the driving electrode layer according to an embodiment of the present invention.
Figure 6A:
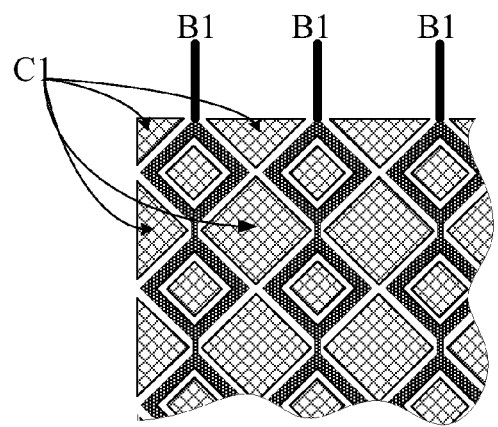
FIG. 6A is a schematic diagram, partially showing a sensing electrode layer having sensing electrodes with diamond hollowed-out regions, leads B1 of the sensing electrode layer, and suspended blocks C1 according to an embodiment of the present invention.
Figure 6B:
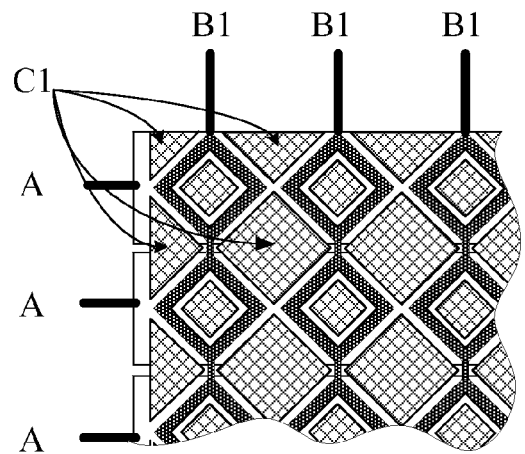
FIG. 6B is a schematic assembled view of a structure comprising the driving electrodes of FIG. 5 and the sensing electrodes of FIG. 6A.
Figure 7A:
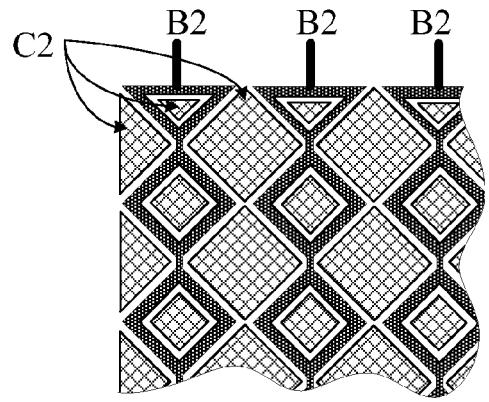
FIG. 7A is a schematic diagram, partially showing a sensing electrode layer having sensing electrodes with diamond hollowed-out regions, leads B2 of the sensing electrode layer and suspended blocks C2, according to another embodiment of the present invention.
Figure 7B:
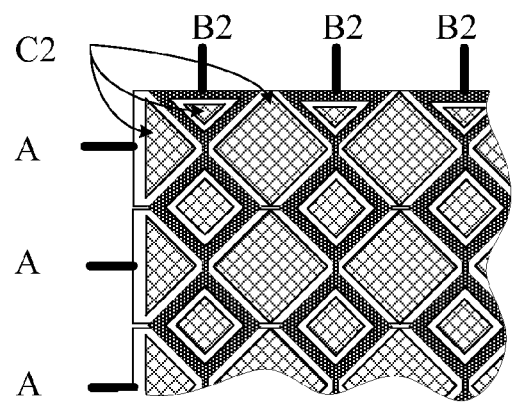
FIG. 7B is a schematic assembled view of a structure including the driving electrodes of FIG. 5 and the sensing electrodes of FIG. 7A.
Figure 8A:
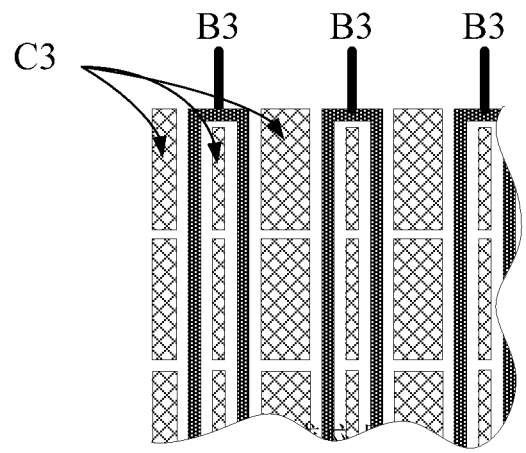
FIG. 8A is a schematic diagram, partially showing a sensing electrode layer having sensing electrodes with rectangular hollowed-out regions, leads B3 of the sensing electrode layer and suspended blocks C3, according to an embodiment of the present invention.
Figure 8B:
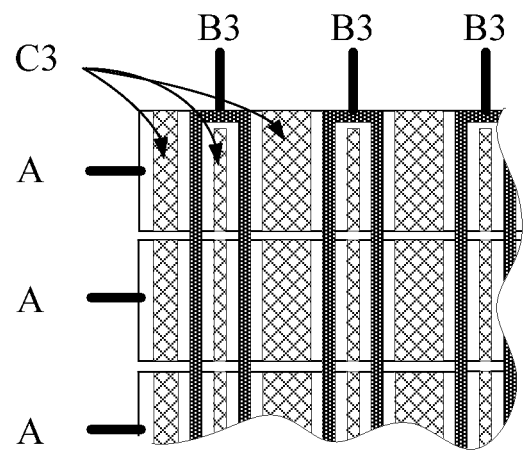
FIG. 8B is a schematic assembled view of a structure including the driving electrodes of FIG. 5 and the sensing electrodes of FIG. 8A.
Figure 9A:
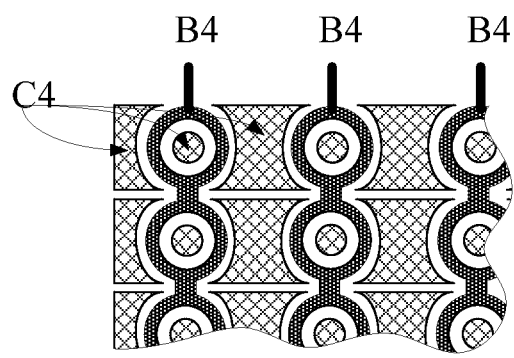
FIG. 9A is a schematic diagram, partially showing a sensing electrode layer having sensing electrodes with round hollowed-out regions, leads B4 of the sensing electrode layer and suspended blocks C4, according to an embodiment of the present invention.
Figure 9B:
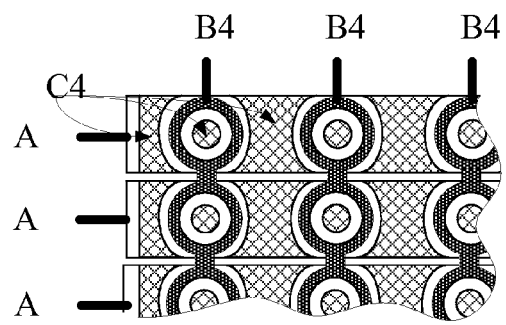
FIG. 9B is a schematic assembled view of a structure including the driving electrodes of FIG. 5 and the sensing electrodes of FIG. 9A.
Figure 10A:
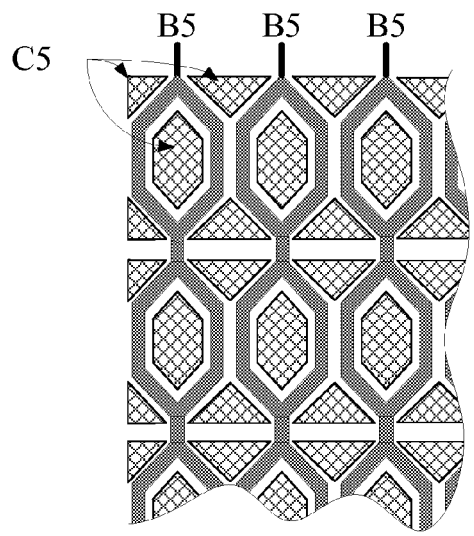
FIG. 10A is a schematic diagram, partially showing a sensing electrode layer having sensing electrodes with hexagonal hollowed-out regions, leads B5 of the sensing electrode layer and suspended blocks C5, according to an embodiment of the present invention.
Figure 10B:
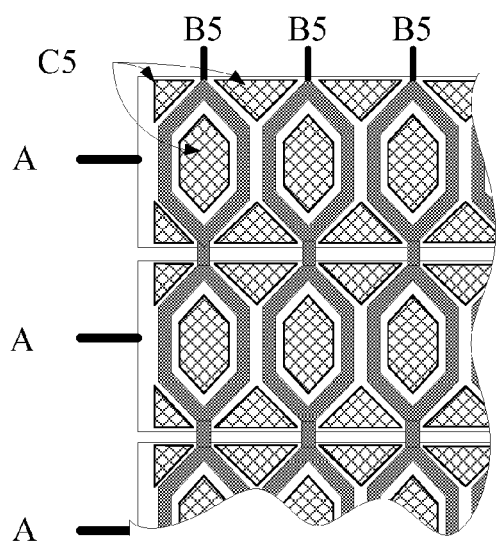
FIG. 10B is a schematic assembled view of a structure including the driving electrodes of FIG. 5 and the sensing electrodes of FIG. 10A.

In the embodiments of the present invention, to ensure uniform light transmittance of the entire screen, suspended blocks are filled in the hollowed-out regions and/or between the sensing electrodes. Gaps are left between the suspended blocks and the sensing electrodes. The suspended blocks can have any specific shape flexibly designed according to the shape of the sensing electrodes. FIG. 5 is a schematic diagram, partially showing a driving electrode layer and leads A of the driving electrode layer according to an embodiment of the present invention. FIG. 6A is a schematic diagram, partially showing a sensing electrode layer having diamond pattern sensing electrodes with hollowed-out regions, leads B1 of the sensing electrode layer, and suspended blocks C1 according to an embodiment of the present invention. FIG. 6B is a schematic assembled view of a structure including the driving electrodes of FIG. 5 and the sensing electrodes of FIG. 6A. FIG. 7A is a schematic diagram, partially showing a sensing electrode layer having diamond pattern sensing electrodes with hollowed-out regions, leads B2 of the sensing electrode layer and suspended blocks C2, according to another embodiment of the present invention. FIG. 7B is a schematic assembled view of a structure including the driving electrodes of FIG. 5 and the sensing electrodes of FIG. 7A. FIG. 8A is a schematic diagram, partially showing a sensing electrode layer having rectangular pattern sensing electrodes with hollowed-out regions, leads B3 of the sensing electrode layer and suspended blocks C3, according to an embodiment of the present invention. FIG. 8B is a schematic assembled view of a structure including the driving electrodes of FIG. 5 and the sensing electrodes of FIG. 8A. FIG. 9A is a schematic diagram, partially showing a sensing electrode layer having round pattern sensing electrodes with hollowed-out regions, leads B4 of the sensing electrode layer and suspended blocks C4, according to an embodiment of the present invention. FIG. 9B is a schematic assembled view of a structure including the driving electrodes of FIG. 5 and the sensing electrodes of FIG. 9A. FIG. 10A is a schematic diagram, partially showing a sensing electrode layer having hexagonal pattern sensing electrodes with hollowed-out regions, leads B5 of the sensing electrode layer and suspended blocks C5, according to an embodiment of the present invention. FIG. 10B is a schematic assembled view of a structure including the driving electrodes of FIG. 5 and the sensing electrodes of FIG. 10A. In these embodiments, each sensing electrode can have only one hollowed-out region as exemplarily shown in FIG. 8A, or have multiple hollowed-out regions separate from each other as exemplarily shown in FIG. 6A, FIG. 7A, FIG. 9A and FIG. 10A.

At the same time, the initial capacitance can be adjusted by adjusting the area of the hollowed-out regions, for adapting to different situations, such as the capacitive touch sensors with different thickness. Exemplarily, when the capacitive touch sensor is used in a film touch panel, a distance between the driving electrode layer and the sensing electrode layer is relatively shorter. According to the formula (2), the initial capacitance $C_0$ is thus increased and the capacitance change rate is thus reduced. At this time, the area of the hollowed-out regions can be increased to reduce the overlapping area between the driving electrode layer and the sensing electrode layer. Thus, the initial capacitance is reduced to counteract the negative impact of the small capacitance change rate caused by the short distance between the driving electrode layer and the sensing electrode layer.

In actually practice, the above-mentioned capacitive touch sensors can be used in touch detection devices, or directly used in various capacitive touch terminals, such as capacitive touch button control terminals, capacitive touch slider control terminals, capacitive touch wheel control terminals or capacitive touch screen terminals.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A capacitive touch sensor comprising:
a driving electrode layer,
a sensing electrode layer,
an insulating isolation layer disposed between the sensing electrode layer and the driving electrode layer, and
a touch panel disposed over the sensing electrode layer,
wherein the sensing electrode layer has hollowed-out sensing electrodes,
wherein a non-hollowed-out region of each sensing electrode fully overlaps a driving electrode of the driving electrode layer,
wherein each sensing electrode has one or more hollowed-out regions separate from each other,
wherein suspended blocks are filled in at least one of the hollowed-out sensing electrodes and between the sensing electrodes,
wherein the suspended blocks and overlap the driving electrode,
wherein gaps are left between the suspended blocks and the sensing electrodes,
wherein an initial capacitance between the driving electrode layer and the sensing electrode layer is adjustable by adjusting the area of the hollowed-out regions.

2. A touch detection device, comprising a capacitive touch sensor and a touch controller connected to the capacitive touch sensor, the capacitive touch sensor comprising:
a driving electrode layer,
a sensing electrode layer,
an insulating isolation layer disposed between the sensing electrode layer and the driving electrode layer, and
a touch panel disposed over the sensing electrode layer,
wherein the sensing electrode layer has hollowed-out sensing electrodes,
wherein a non-hollowed-out region of each sensing electrode sensing electrode fully overlaps a driving electrode of the driving electrode layer,
wherein each sensing electrode has one or more hollowed-out regions separate from each other,
wherein suspended blocks are filled in at least one of the hollowed-out sensing electrodes and between the sensing electrodes,
wherein the suspended blocks overlap the driving electrode,
wherein gaps are left between the suspended blocks and the sensing electrodes,
wherein an initial capacitance between the driving electrode layer and the sensing electrode layer is adjustable by adjusting the area of the hollowed-out regions.

3. A touch terminal comprising a touch detection device which comprises a capacitive touch sensor and a touch controller connected to the capacitive touch sensor, the capacitive touch sensor comprising:
a driving electrode layer
and a sensing electrode layer,
an insulating isolation layer being disposed between the sensing electrode layer and the driving electrode layer,
a touch panel being disposed over the sensing electrode layer,
wherein the sensing electrode layer has hollowed-out sensing electrodes,
wherein a non-hollowed-out region of each sensing electrode fully overlaps a driving electrode of the driving electrode layer,
wherein each sensing electrode has one or more hollowed-out regions separate from each other,
wherein suspended blocks are filled in the hollowed-out sensing electrodes and/or and between the sensing electrodes,
wherein the suspended blocks overlap the driving electrodes, and
wherein gaps are left between the suspended blocks and the sensing electrodes
wherein an initial capacitance between the driving electrode layer and the sensing electrode layer is adjustable by adjusting the area of the hollowed-out regions.

4. A capacitive touchscreen device, comprising:
a driving electrode layer including a plurality of driving electrodes;
a sensing electrode layer including a plurality of sensing electrodes;
an insulating isolation layer disposed between the sensing electrode layer and the driving electrode layer; and
a touch panel disposed on the sensing electrode layer, wherein each sensing electrode includes a plurality of hollowed-out regions separate from each other,
wherein each sensing electrode is filled with suspended blocks and a plurality of non-hollowed-out regions,
wherein each non-hollowed-out region fully overlaps a driving electrode,
wherein gaps are left between the suspended blocks and the sensing electrodes,
wherein an initial capacitance between the driving electrode layer and the sensing electrode layer is adjustable by adjusting the area of the hollowed-out regions.

* * * * *